(12) United States Patent
Arashima et al.

(10) Patent No.: US 7,183,802 B2
(45) Date of Patent: Feb. 27, 2007

(54) SEMICONDUCTOR OUTPUT CIRCUIT

(75) Inventors: Yoshinori Arashima, Gamagoori (JP);
Hirofumi Abe, Gamagoori (JP);
Shigeki Takahashi, Okazaki (JP)

(73) Assignee: Denso Corporation, Kariya (JP)

( * ) Notice: Subject to any disclaimer, the term of this patent is extended or adjusted under 35 U.S.C. 154(b) by 168 days.

(21) Appl. No.: 11/079,517

(22) Filed: Mar. 15, 2005

(65) Prior Publication Data

US 2005/0201027 A1 Sep. 15, 2005

(30) Foreign Application Priority Data

Mar. 15, 2004 (JP) .............. 2004-072647

(51) Int. Cl.
*H03K 19/0175* (2006.01)
(52) U.S. Cl. .............. 326/80; 326/81; 326/82; 361/56; 361/91.1
(58) Field of Classification Search ............ 326/80–81; 361/56, 91.1
See application file for complete search history.

(56) References Cited

U.S. PATENT DOCUMENTS

| | | | |
|---|---|---|---|
| 5,610,791 A | 3/1997 | Voldman | |
| 5,705,941 A | 1/1998 | Fukazawa et al. | |
| 5,793,588 A | 8/1998 | Jeong | |
| 5,821,587 A | 10/1998 | Jeong | |
| 5,945,713 A | 8/1999 | Voldman | |
| 6,078,514 A | 6/2000 | Takemae et al. | |
| 6,385,028 B1 | 5/2002 | Kouno | |
| 6,396,125 B1 | 5/2002 | Soyano | |
| 6,614,633 B1 | 9/2003 | Kohno | |
| 6,888,711 B2* | 5/2005 | Kohno | ............ 361/91.1 |
| 2004/0095699 A1 | 5/2004 | Kohno | |

FOREIGN PATENT DOCUMENTS

| | | |
|---|---|---|
| JP | 7-335834 | 12/1995 |
| JP | 8-111508 | 4/1996 |
| JP | 9-191081 | 7/1997 |
| JP | 10-84083 | 3/1998 |
| JP | 11-86546 | 3/1999 |
| JP | 2000-77537 | 3/2000 |
| JP | 2000-261216 | 9/2000 |
| JP | 2000-269435 | 9/2000 |
| JP | 2001-44291 | 2/2001 |
| JP | 2001-53220 | 2/2001 |

* cited by examiner

*Primary Examiner*—Anh Q. Tran
(74) *Attorney, Agent, or Firm*—Posz Law Group, PLC

(57) ABSTRACT

The semiconductor output circuit of the invention has an insulated gate transistor including a first terminal, a second terminal and a gate terminal, a conductive state of the insulated gate transistor being controlled by a drive circuit connected to the gate terminal, a capacitive element and a first resistor connected in series between the second terminal and the gate terminal, and a second resistor connected between the gate terminal and the first terminal. The insulated gate transistor has a cell area formed on a semiconductor substrate, in which a plurality of unit cells each defining a unit transistor connected between the first and second terminals are laid out. The second resistor has such a resistance that all of the unit transistors defined by the unit cells are turned on uniformly when electrostatic discharge is applied to the first or second terminal.

7 Claims, 10 Drawing Sheets

SEMICONDUCTOR OUTPUT CIRCUIT

CROSS-REFERENCE TO RELATED APPLICATION

This application is related to Japanese Patent Applications No. 2004-72647 filed on Mar. 15, 2004, the contents of which are hereby incorporated by reference.

BACKGROUND OF THE INVENTION

1. Field of the Invention

The present invention relates to a semiconductor output circuit having a protective measure against static electricity.

2. Description of Related Art

As disclosed in Japanese Patent Nos. 2000-077537, 2000-269435, and 2001-044291, for example, it is known to provide a protective circuit to a semiconductor output circuit that includes an insulated gate transistor such as a power MOSFET and IGBT, and a drive circuit applying a gate drive signal to the gate of the insulated gate transistor in order to improve resistance to ESD (electrostatic discharge) of the semiconductor output circuit.

FIG. 11 shows a structure of a typical semiconductor output circuit provided with such a protective circuit. As shown in this figure, this semiconductor output circuit 101 includes a MOS transistor 104, a drive circuit 106, a protective circuit 110, and external terminals 102, 103. The external terminals 102, 103 are connected to the drain and source of the MOS transistor 104, respectively. A resistor 105 is connected between the gate and source of the MOS transistor 104 for the purpose of pulling down the gate voltage to the ground potential. The protective circuit 110, an input of which is connected to the external terminal 102 and an output of which is connected to a node of the gate of the MOS transistor 104 and the resistor 105, includes a diode 109, a transistor 107, and a resistor 108. The output of the drive circuit 106 is connected to this node.

If a high voltage is applied between the terminals 102, 103 due to ESD (electrostatic discharge), the transistor 107 of the protective circuit 110 is turned on, and accordingly, the gate of the MOS transistor 104 is applied with the high voltage. As a consequence, the conductivity between the drain and source of the MOS transistor 104 increases to allow a surge current to flow therethrough. This action of the protective circuit 110 improves the resistance to ESD of the semiconductor output circuit 101.

However, as explained in detail later, in a case where a LDMOS transistor (Laterally Diffused MOS transistor) is used as the MOS transistor 104, it often occurs that the drain current (surge current) is concentrated on an outer portion of a cell area of the LDMOSFET when a high voltage is applied between the terminals 102, and 103, and accordingly, the semiconductor output circuit does not exhibit adequate resistance to static electricity.

SUMMARY OF THE INVENTION

A semiconductor output circuit of the invention has a structure including:

an insulated gate transistor including a first terminal, a second terminal and a gate terminal, a conductive state of the insulated gate transistor being controlled by a drive circuit connected to the gate terminal;

a capacitive element and a first resistor connected in series between the second terminal and the gate terminal;

a second resistor connected between the gate terminal and the first terminal;

the insulated gate transistor having a cell area formed on a semiconductor substrate, in which a plurality of unit cells each defining a unit transistor connected between the first and second terminals are laid out, the second resistor having such a resistance that all of unit transistors defined by the unit cells are turned on uniformly when electrostatic discharge is applied to the first or second terminal.

With this structure, since all the unit transistors in the cell area turn on uniformly if a spike voltage is applied to the first or second terminal, it becomes possible to avoid a situation where the drain current is concentrated on the outer portion of the cell area.

The first and second resistors may be connected in series between the gate terminal and the first terminal, and the drive circuit may be connected to the gate terminal of the insulated gate transistor through the first resistor.

The capacitive element is preferably a bipolar transistor for reducing a layout size of the semiconductor output circuit.

The insulated gate transistor may be an LDMOS transistor.

PREFERRED EMBODIMENTS OF THE INVENTION

First Embodiment

Figure 1:
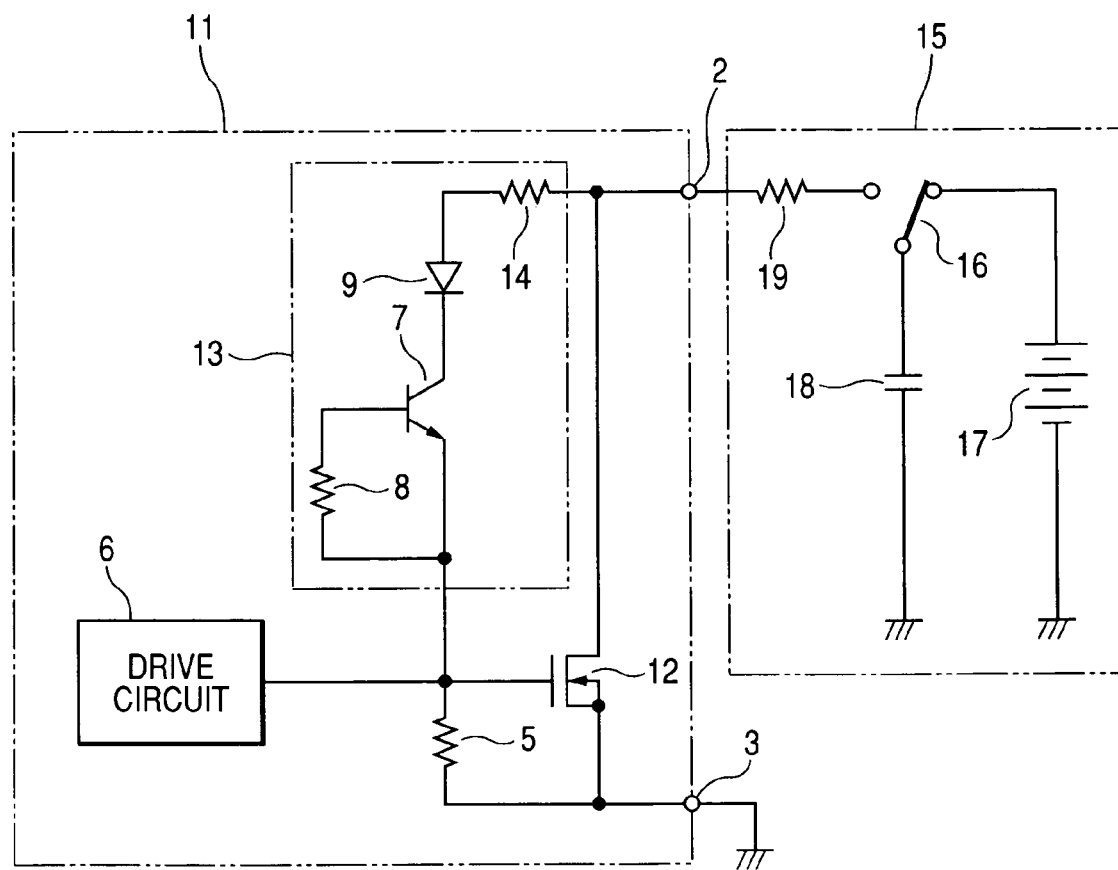
FIG. 1 is a diagram showing a structure of a semiconductor output circuit according to a first embodiment of the invention.

FIG. 1 shows a structure of a semiconductor output circuit 11 according to a first embodiment of the invention, and a structure of an ESD test device 15 used for testing the resistance to ESD of the semiconductor output circuit 11. For example, the semiconductor output circuit 11 can be used for an electronic control unit implemented as an IC or an intelligent IC to be mounted on a vehicle (automobile) that includes a CPU, a digital circuit, memories, an analog circuit, and a power supply circuit.

As shown in this figure, this semiconductor output circuit 11 includes an n-channel type LDMOS transistor 12, a drive circuit 6, a protective circuit 13, and external terminals 2, 3. The external terminals 2, 3 are connected to the drain and source of the MOS transistor 12, respectively. The gate and source of the MOS transistor 12 are electrically connected to each other by a resistor 5 for the purpose of pulling down the gate potential of the MOS transistor 12 to the ground potential. The drive circuit 6 operates to control on/off of the MOS transistor 12 by applying a gate control voltage to the gate of the MOS transistor 12.

The protective circuit 13, an input of which is connected to the external terminal 2 and an output of which is connected to the node of the resistor 5 and the gate of the MOS transistor 12, include a resistor 14, a back-flow preventing diode, an NPN transistor 7, and a resistor 8 connected between the base and emitter of the transistor 7. Since a current as large as several mA may flow through the resistor 14 momentarily, a diffused resistor is used as the resistor 14. The diode 9 serves to prevent a current from flowing from the drive circuit 6 to the external terminal 2.

The ESD test device 15 includes a high voltage source 17, a capacitor 18, a switch 16, and a resistor 19. To simulate ESD (electrostatic discharge), the switch 16 is set to the side of the high voltage source 17 for charging the capacitor 18, and then set to the side of the resistor 19 so that the discharge voltage of the capacitor 18 is applied to the external 2 of the semiconductor output circuit 11.

Figure 2:
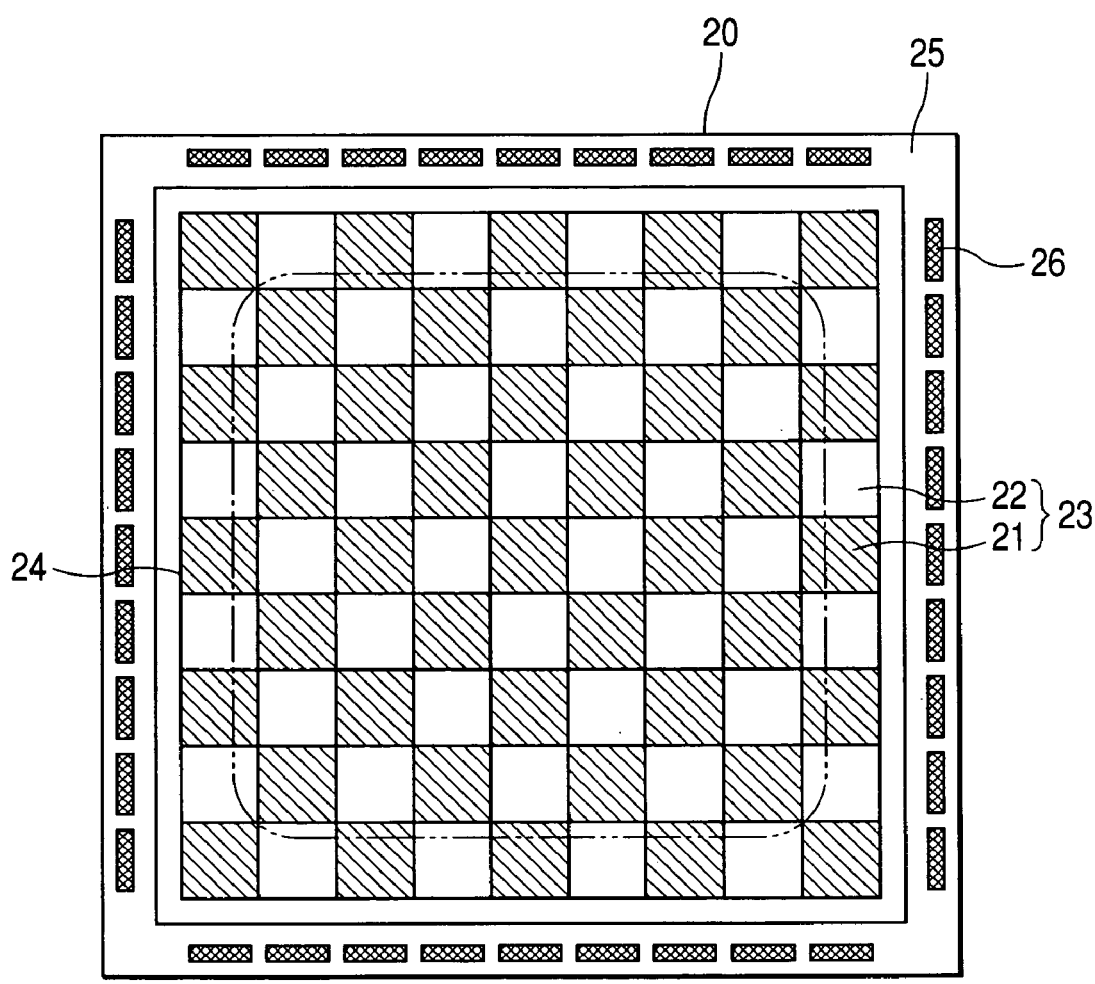
FIG. 2 is a plan view of an LDMOS transistor included in the semiconductor output circuit according to the first embodiment of the invention.

FIG. 2 is a plan view of the LDMOS transistor 12. As shown in this figure, the LDMOS transistor 12 has a number of unit cells 23 each of which has a pair of a source cell 21 and a drain cell 22 constituting a unit transistor within a cell area 24 formed on a semiconductor substrate 20. A gate lead Al wire 25 is formed so as to surround the cell area 24. The gate lead Al wire 25 is isolated from a polysilicon layer (not shown) serving as gate electrodes of the unit transistors by an insulation film (not shown) put between the gate lead Al wire 25 and the polysilicon layer. The gate lead Al wire 25 is electrically connected to the polysilicon layer through gate contacts 26 formed around the cell area 24.

Figure 3:
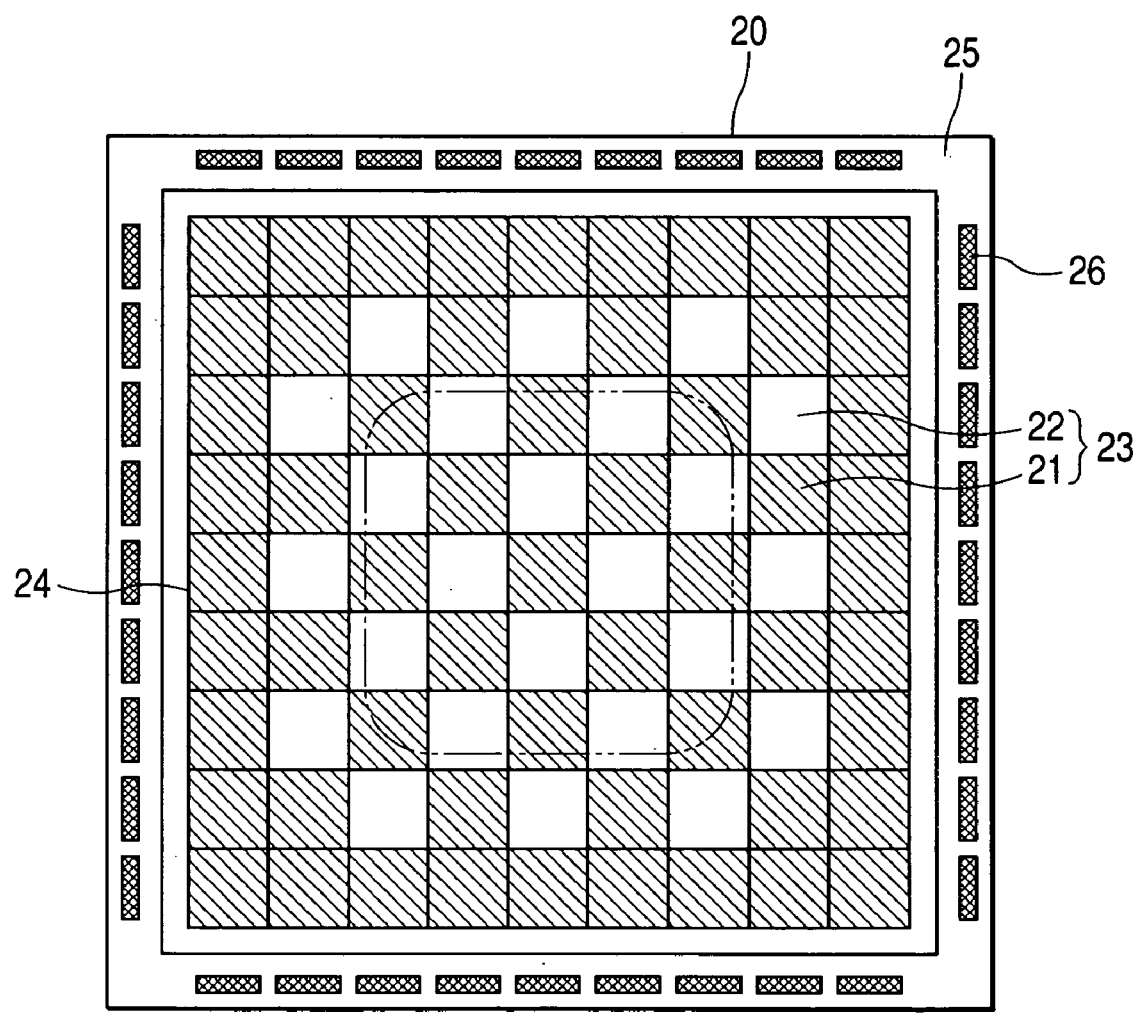
FIG. 3 is a plan view of a different LDMOS transistor useable for the semiconductor output circuit of the invention.
Figure 4:
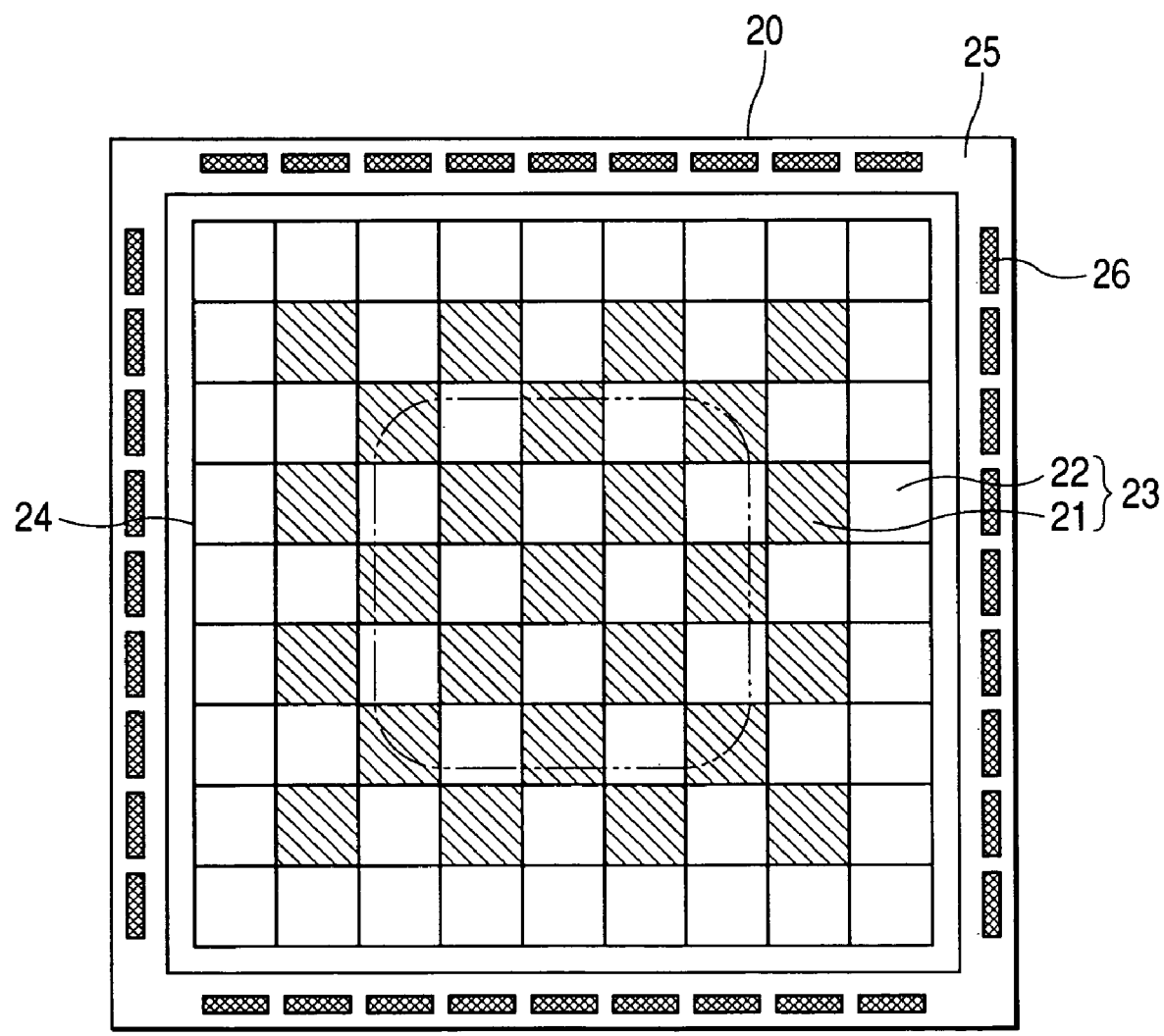
FIG. 4 is a plan view of another different LDMOS transistor useable for the semiconductor output circuit of the invention.

The LDMOS transistor 12 may have a different layout pattern of the source cell 21 and drain cell 22 as shown in plan views of FIG. 3 and FIG. 4. In the case shown in FIG. 3, the source cells 21 are laid along the entire length of the peripheral border of the cell area 24. In the case shown in FIG. 4, the drain cells 22 are laid along the entire length of the peripheral border of the cell area 24.

Next, the behavior of the semiconductor output circuit 11 is explained. First, explanation is made about a case A where the semiconductor output circuit 11 is not provided with the protective circuit 13, and then about a case B where the semiconductor output circuit 11 is provided with the protective circuit 13 in order to make clear the significance of the protective circuit 13.

Case A

Since the potential of the gate of the MOS transistor 12 is pulled down to the ground potential by the action of the resistor 5 connected between the gate and source of the MOS transistor 12, the MOS transistor 12 stays off not only while the drive circuit 6 outputs a low level voltage to the gate of the MOS transistor 12 but also while the output of the drive circuit 6 is in a high-impedance state. The MOS transistor 12 has parasitic capacitances (a source/gate capacitance, a drain/gate capacitance, and a source/drain capacitance). Accordingly, if a spike voltage is applied to the terminal 2, the potential of the inner portion of the cell area 24 (the portion surrounded by the chain dashed-line in FIGS. 2 to 4) of the MOS transistor 12 increases due to the parasitic capacitances. However, the potential of the outer portion closer to the gate contacts 26 of the cell area 24 (the portion outside the chain dashed-line) does not increase much due to the voltage pull-down action of the resistor 5.

Figure 5:
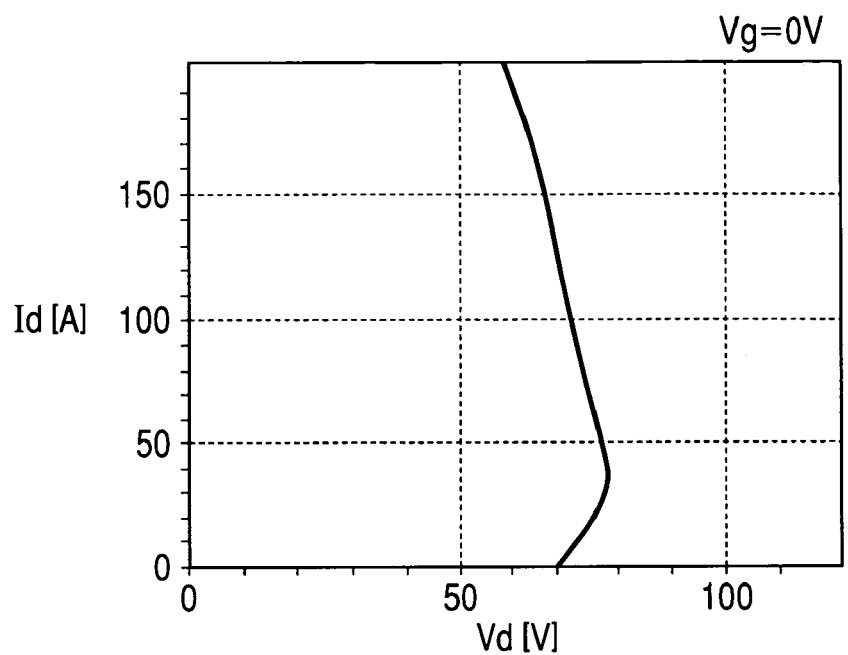
FIG. 5 is a graph showing a relationship between the drain voltage and the drain current of the LDMOS transistor when the gate voltage is 0V.
Figure 6:
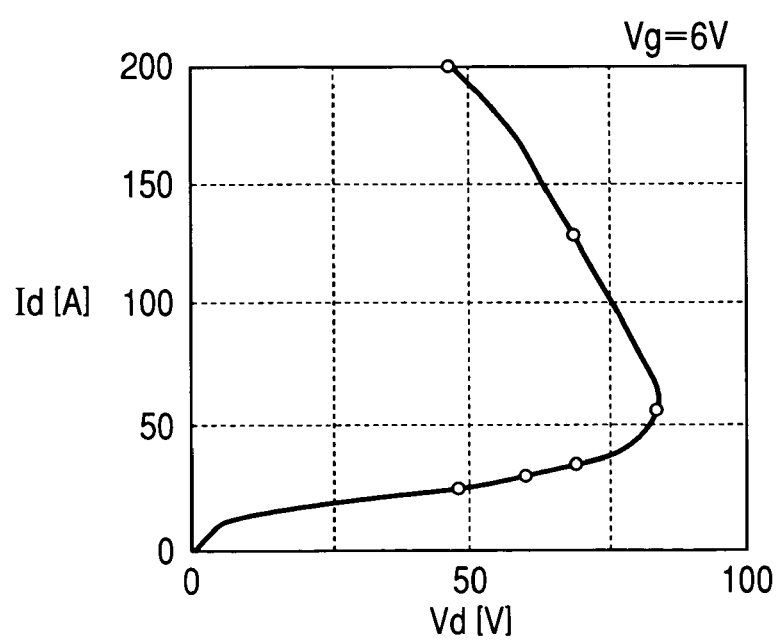
FIG. 6 is a graph showing a relationship between the drain voltage and the drain current of the LDMOS transistor when the gate voltage is 6V.

Here, the drain voltage-drain current characteristic of the MOS transistor 12 is explained below. FIGS. 5 and 6 are graphs showing a relationship between the drain voltage Vd and the drain current Id of the MOS transistor 12 when the gate voltage Vg is 0V and 6V, respectively.

As shown in FIG. 5, when the gate voltage is 0V where the MOS transistor is in an off state, the drain current Id starts to flow if the drain voltage Vd exceeds 70 V. And if the drain voltage Vd reaches 80V, the MOS transistor 12 exhibits negative resistance because of positive feedback, and the drain current Id therefore grows excessively large.

On the other hand, when the gate voltage is 6V where the MOS transistor is an on state, the drain current Id increases as the drain voltage increases from 0V. And if the drain voltage Vd reaches 80V, the MOS transistor 12 exhibits negative resistance because of positive feedback, and the drain current Id therefore grows excessively large.

For the unit transistors within the inner portion of the cell area 24, if a spike voltage is applied to the terminal 2 and accordingly their drain voltages increase, their gate voltages also increase because of their parasitic capacitances. In consequence, the unit transistors are turned on and their drain voltages are therefore lowered, so that they do not enter the negative resistance region, thereby preventing their drain currents from growing excessively large.

However, for the unit transistors within the outer portion of the cell area 24, their gate voltages are kept at low levels by the voltage-pull down action of the resistor 5. Accordingly, the unit transistors stay off even if the spike voltage is applied to the terminal 2, so that their drain voltage increases. As a result, the unit transistors enter the negative resistance region, and their drain currents grow excessively large.

Hence, the semiconductor output circuit 11 not provided with the protective circuit 13 does not exhibit adequate resistance to static electricity.

Case B

If a spike voltage is applied to the terminal 2 of the semiconductor output circuit 11 provided with the protective circuit 13, a surge current flows through the resistor 14, the diode 9, and the collector/base capacitance (junction capacitance) of the transistor 7. As a consequence, the gate voltage of the MOS transistor 12 increases. Accordingly, not only the unit transistors within the inner portion of the cell area 24 but also the unit transistors within the outer portion of the cell area 24 are turned on if the spike voltage is applied to the terminal 2, so that all the unit transistors in the cell area 24 can be prevented from entering the negative resistance region.

Figure 11:
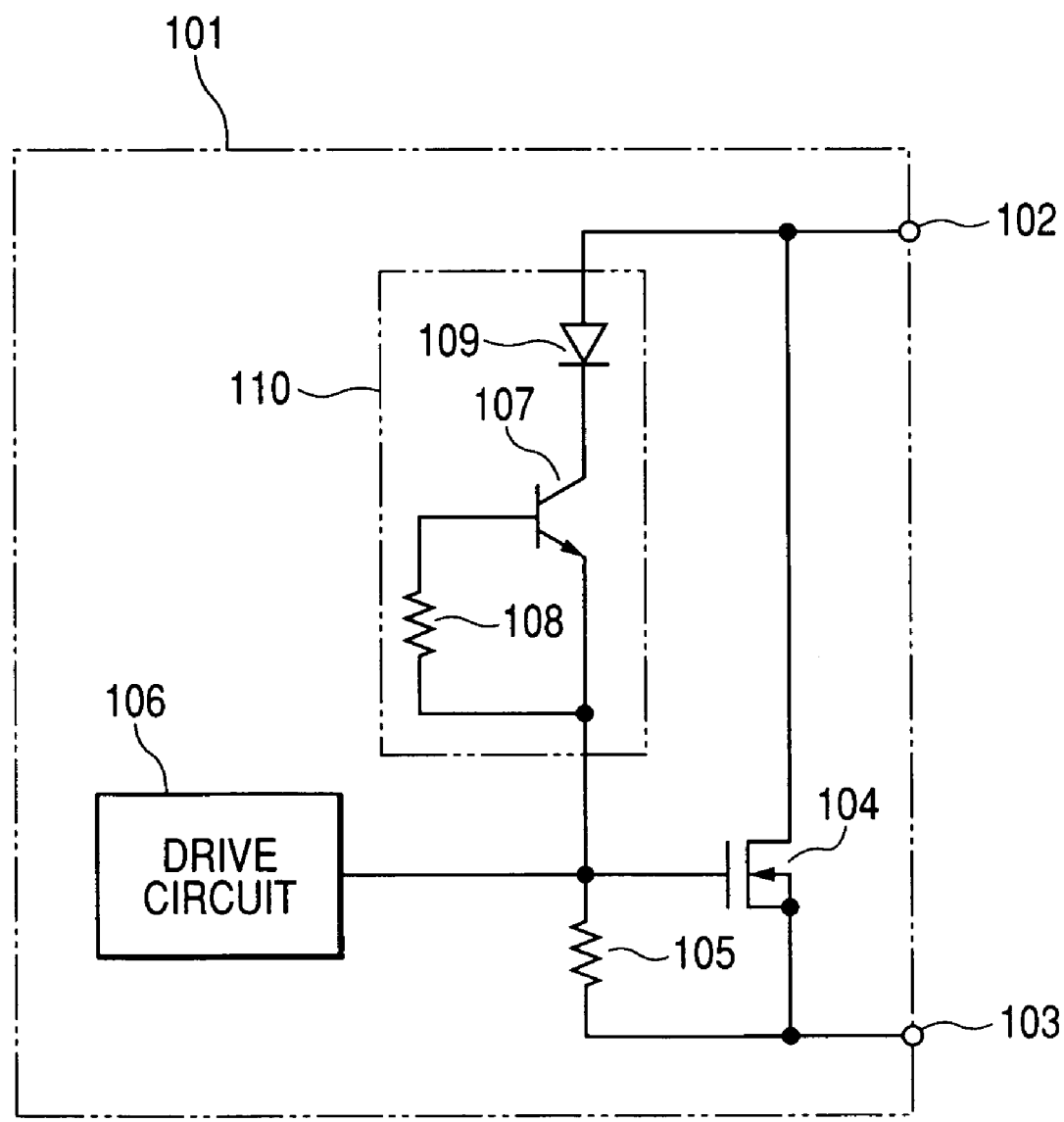
FIG. 11 is a diagram showing a structure of a prior art semiconductor output circuit.

However, in a case where the protective circuit 13 does not have the resistor 14 as is the case with the prior art circuit shown in FIG. 11, if a spike voltage is applied to the terminal 2, the gate voltages of the unit transistors within the outer portion of the cell area 24 increase faster than those of the unit transistors within the inner portion of the cell area 24, and as a consequence, the surge current is concentrated on the outer portion, which degrades the resistance to static electricity of the semiconductor output circuit 11. The reason for that is explained below with reference to FIG. 7.

Figure 7:
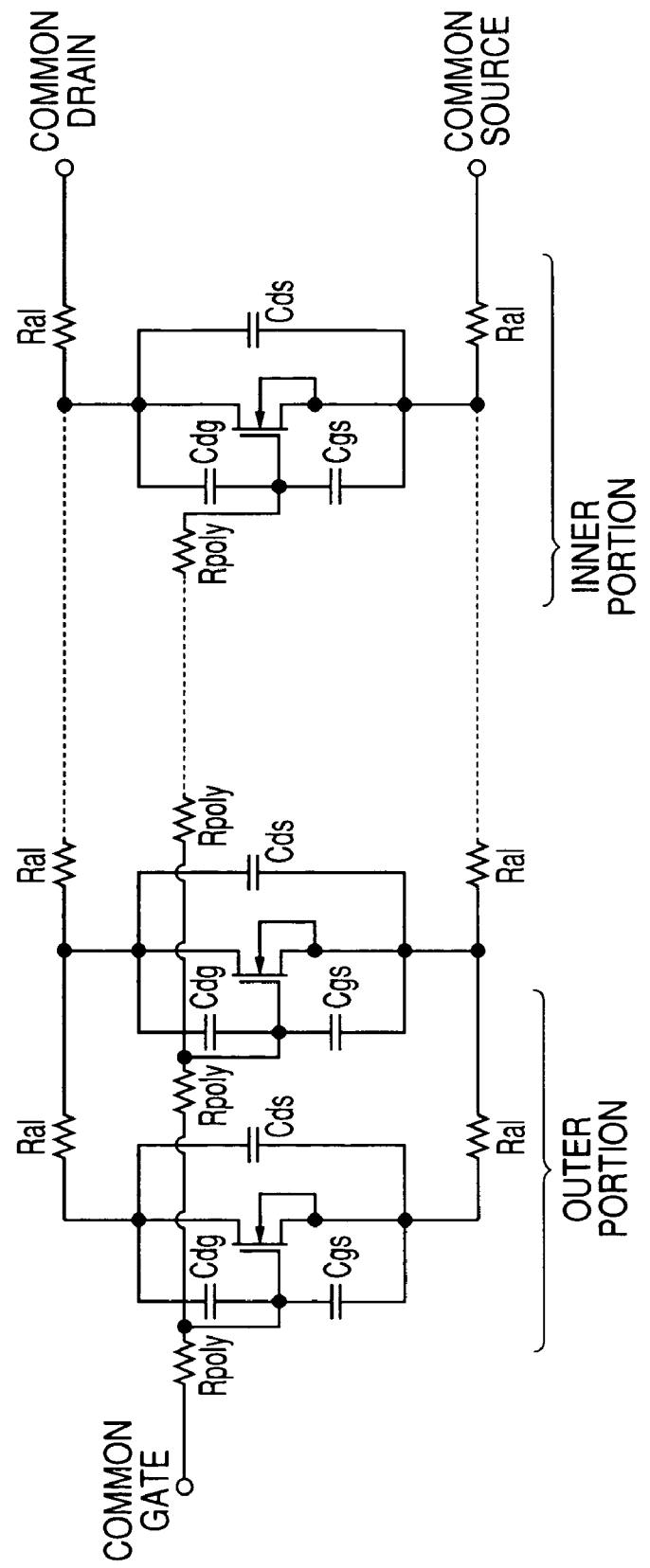
FIG. 7 is an equivalent circuit diagram of the LDMOS transistor.

FIG. 7 shows an equivalent circuit of the LDMOS transistor 12. As shown in this figure, the LDMOS transistor 12 can be regarded as a transistor assembly including a plurality of MOS transistors connected in parallel between a common drain and a common source. In this figure, Ral denotes a wire resistance, Rpoly denotes a gate polysilicon resistance, Cdg denotes a drain/gate parasitic capacitance, Cgs denotes a gate/source parasitic capacitance, and Cds denotes a drain/source parasitic capacitance.

The unit cells 23 each defining a unit MOS transistor within the outer portion of the cell area 24 are susceptible to the voltage change of the common gate, and accordingly their gate voltages change rapidly following the change of the output of the protective circuit 13. On the other hand, the unit cells 23 within the inner portion of the cell area 24 are insensitive to the voltage change of the common gate compared to the unit cells within the outer portion, because the voltage change of the common gate travels to each unit cell through the gate polysilicon resistances Rpoly. Accordingly, the increase of the gate voltage when a spike voltage is applied to the terminal 2 is mainly caused by the output of the protective circuit 13 for the unit cells within the outer portion, while it is mainly caused by the parasitic capacitances of the unit MOS transistor for the unit cells within the inner portion.

Hence, in a case where the protective circuit 13 does not have the resistor 14, the gate voltages of the unit cells 23 within the inner portion of the cell area 24 change slowly compared to the unit cells within the outer portion.

For such reasons, the surge current is concentrated on the outer portion of the cell area 24 when a spike voltage is applied to the terminal 2.

Accordingly, in this embodiment, the resistor 14 is connected between the terminal 2 and the diode 9 in order to suppress a current flowing to the transistor 7, so that the rising speed of the voltage of the common gate of the MOS transistor 12 is lowered to such an extent that the gate voltages of the unit MOS transistors in the outer portion and the inner portion rise at a uniform rate so that they are turned on uniformly.

Figure 8:
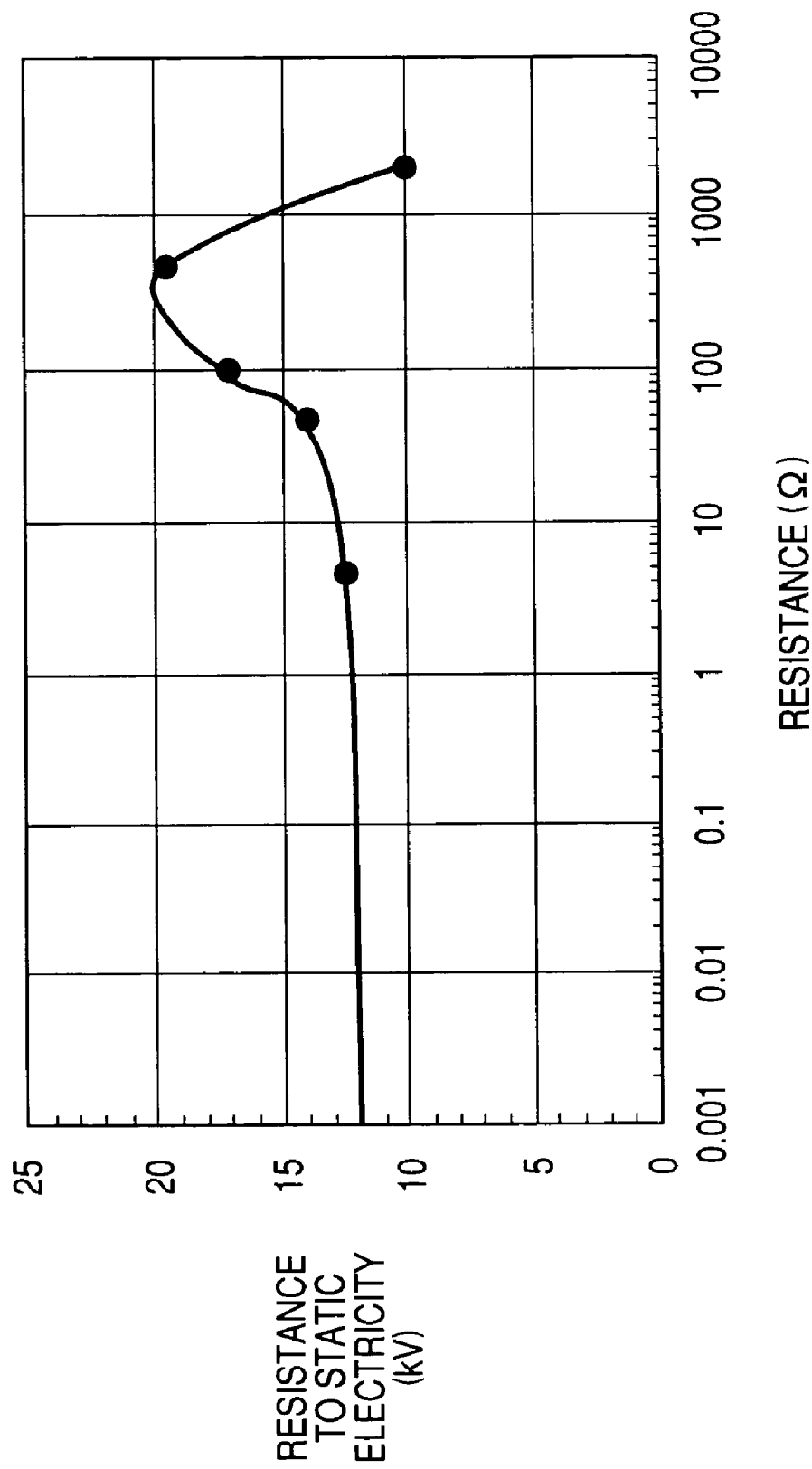
FIG. 8 is a graph showing measured values of resistance to static electricity of the semiconductor output circuit according to the first embodiment of the invention.

FIG. 8 is a graph showing actual values of the resistance to static electricity (kV) of the semiconductor output circuit 11 measured while changing the resistance of the resistor 14. In this measurement, the resistance of the resistor 5 is 1 kΩ, the area of the cell area 24 is 0.5 mm², the resistance of the resistor 19 is 150Ω, the capacitance of the capacitor 18 is 150 pF, and the drive circuit 6 is removed. As shown in this graph, when the resistance of the resistor 14 is smaller than 10Ω, the resistance to static electricity of the semiconductor output circuit 11 is about 12 kV, which is not different from that of the prior art semiconductor output circuit provided with a protective circuit, but not provided with the resistor 14.

Meanwhile, when the resistance of the resistor 14 is larger than 2 kΩ, the resistance to static electricity of the semiconductor output circuit 11 is about 10 kV, which is much the same as that of the prior art semiconductor output circuit not provided with any protective circuit. When the resistance of the resistor 14 is between 50Ω and 500Ω, the semiconductor output circuit 11 exhibits a high resistance to static electricity (20 kV maximum).

The resistance of the resistor 14 can be determined by simulating the performance of the semiconductor output circuit 11 modeled by use of parameters concerning the parasitic capacitances of the MOS transistor 12, junction capacitance of the transistor 7, gate-source resistance of the MOS transistor 12, resistance of parallel combination of the resistor 5 and a resistor between the output terminal of the drive circuit 6 and the ground, capacitance between the output terminal of the drive circuit 6 and the ground, and negative resistance characteristic of the MOS transistor 12. Thus determined resistance of the resistor 14 may be adjusted on the basis of the actually measured values of the resistance to static electricity (kV) of the semiconductor output circuit 11 as shown in FIG. 8.

Since the above parameters vary due to manufacturing variation, it is preferable to design the semiconductor output circuit with consideration given to minimum and maximum values of the parameters. When the semiconductor output circuit 11 is included in a control IC used for an electronic control unit or an intelligent IC to be mounted on a vehicle, it is also desireable to consider actual conditions of electrostatic discharges.

As explained above, the semiconductor output circuit 11 according to this embodiment is provided with the protective circuit 13 in order that all the unit transistors in the cell area 24 of the MOS transistor 12 turn on if a spike voltage is applied to the external terminal 2 due to electrostatic discharge, thereby avoiding a situation where an excessive current flows through the outer portion of the cell area 24 where the unit transistors are in the negative resistance region.

Furthermore, since the protective circuit 13 has the resistor 14 for restraining the current flowing into the transistor 7, all the unit transistors in the inner and outer portions of the cell area 24 turn on uniformly if a spike voltage is applied to the terminal 2, thereby avoiding a situation where the drain current is concentrated on the outer portion of the cell area 24.

The semiconductor output circuit 11 according to this embodiment can be obtained by only adding the resistor 14 to the prior art semiconductor output circuit shown in FIG. 11. Accordingly, with this embodiment, it becomes possible to provide an IC having excellent resistance to static electricity at low costs.

The normalized on-resistance (on resistance per 1 mm2) of the LDMOS transistor is low compared to an up-drain MOS transistor. Therefore, in designing the semiconductor output circuit including such an LDMOS transistor, the surface area of the LDMOS transistor that determines the resistance to static electricity thereof becomes a more determinant factor than the normalized on resistance thereof. This embodiment is advantageous when designing an IC having the capability of resisting static electricity, because the resistance to static electricity of the semiconductor output circuit according to this embodiment is far greater than the prior art semiconductor output circuit including an LDMOS transistor having the same surface area, so that the surface area of the LDMOS transistor can be smaller than the prior art semiconductor output circuit.

Second Embodiment

Figure 9:
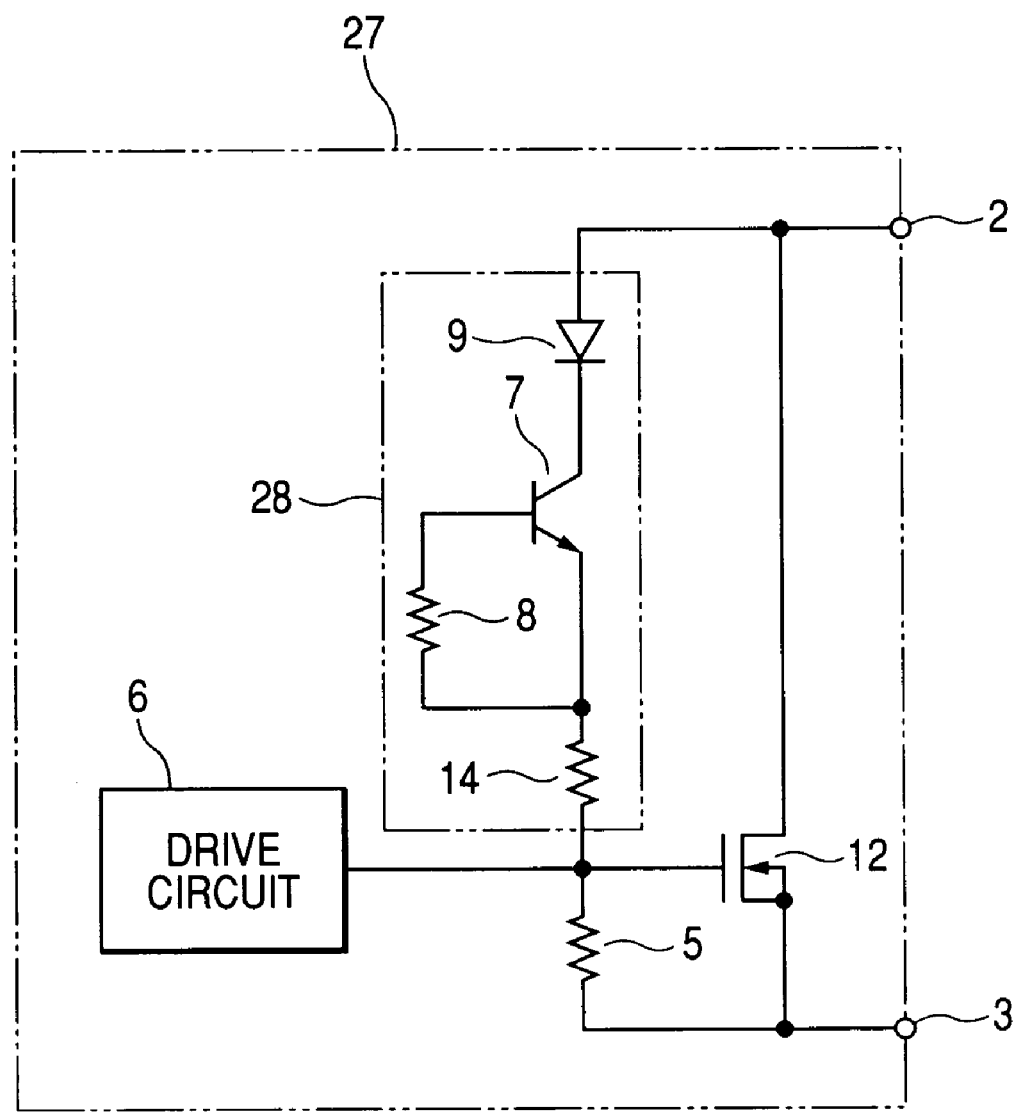
FIG. 9 is a diagram showing a structure of a semiconductor output circuit according to a second embodiment of the invention.

FIG. 9 shows a structure of a semiconductor output circuit 27 according to a second embodiment of the invention. The second embodiment is different from the first embodiment in that, a protective circuit 28 includes the resistor 14 connected between the emitter of the transistor 7 and the node of the resistor 5, the gate of the MOS transistor 12 and the output of the driver circuit 6. Except for that, the semiconductor output circuit 27 according to the second embodiment operates in the same way as the semiconductor output circuit 11 according to the first embodiment.

Third Embodiment

Figure 10:
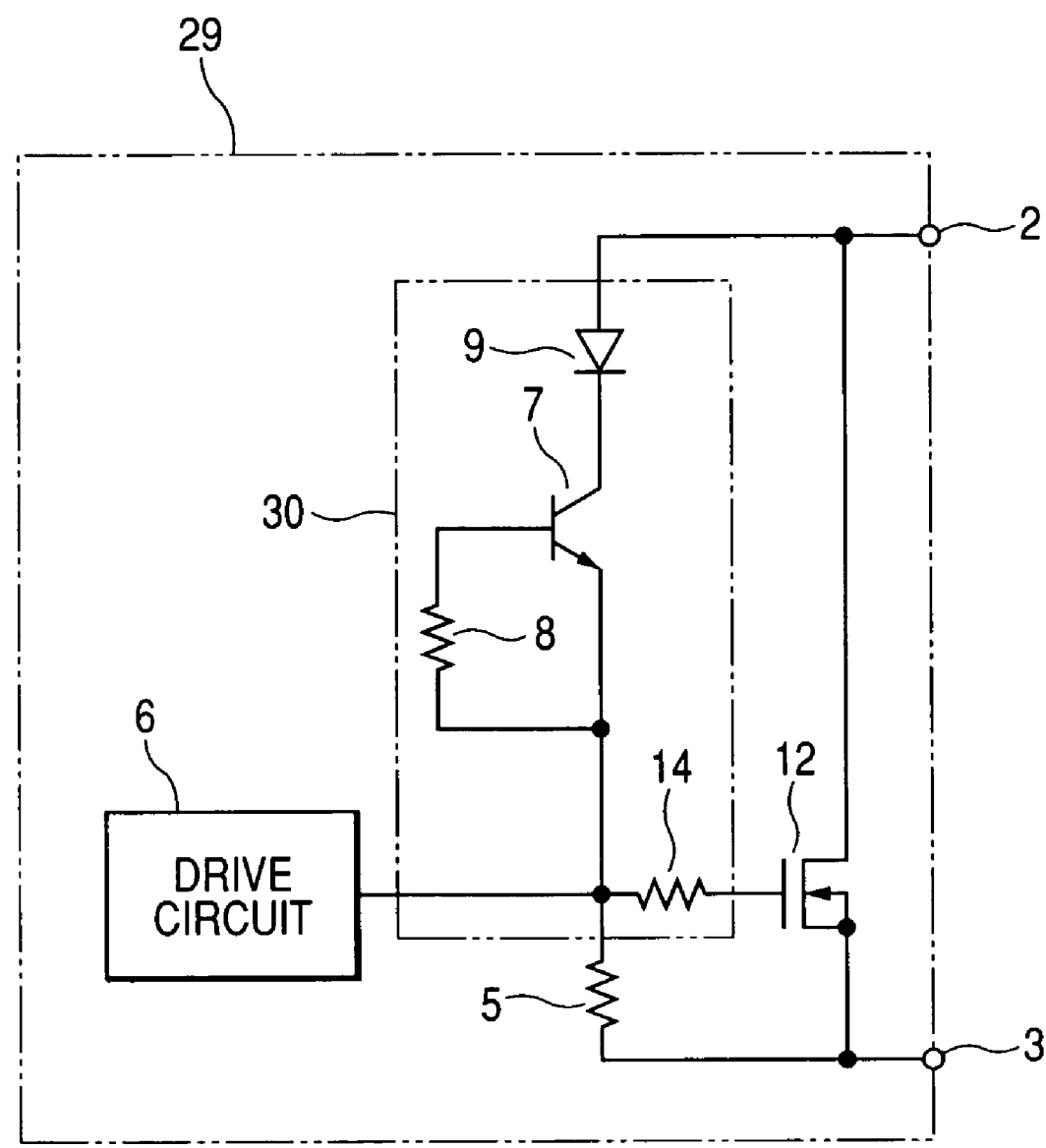
FIG. 10 is a diagram showing a structure of a semiconductor output circuit according to a third embodiment of the invention.

FIG. 10 shows a structure of a semiconductor output circuit 29 according to a third embodiment of the invention. In the third embodiment, a protective circuit 30 has the resistor 14 connected between the gate of the MOS transistor 12 and the node of the resistor 5, the emitter of the transistor 7 and the output of the drive circuit 6. Although the driver circuit 6 drives the gate of the MOS transistor 12 by way of the resistor 14 in the third embodiment, the semiconductor output circuit 29 according to the third embodiment provides the same advantage as the first embodiment. The resistances of the resistor 14 and the resistor 5 can be determined by simulating the performance of the semiconductor output circuit 29 modeled by use of various parameters as is the case with the first embodiment.

Other Embodiments

Although the semiconductor output circuits according to the above embodiments use the LDMOS transistor, an up-drain MOS transistor or VDMOS transistor may be used instead.

In the above embodiments, explanation is made about the case where an electric load is connectable to the drain of the MOS transistor 12 (low-side connection), however, the present invention is applicable to a case where an electric load is connected to the source of the MOS transistor 12 (high-side connection).

The electric load may be connected to the drain or source of the MOS transistor 12 through a current detecting device.

Instead of the transistor 7, a capacitor may be used if it has a capacitance that matches the above explained parameters such as the parasitic capacitances of the MOS transistor 12.

The diode 9 may be removed if there is no fear of current back-flow.

The base and emitter of the transistor 7 may be short-circuited.

The resistor 14 may be a thin-film resistor or a printed resistor.

The above explained preferred embodiments are exemplary of the invention of the present application which is described solely by the claims appended below. It should be understood that modifications of the preferred embodiments may be made as would occur to one of skill in the art.

What is claimed is:

1. A semiconductor output circuit comprising:
   an insulated gate transistor including a first terminal, a second terminal and a gate terminal, a conductive state of said insulated gate transistor being controlled by a drive circuit connected to said gate terminal;
   a capacitive element and a first resistor connected in series between said second terminal and said gate terminal;
   a second resistor connected between said gate terminal and said first terminal;
   said insulated gate transistor having a cell area formed on a semiconductor substrate, in which a plurality of unit cells each defining a unit transistor connected between said first and second terminals are laid out,
   said second resistor having such a resistance that all of unit transistors defined by said unit cells are turned on uniformly when electrostatic discharge is applied to said first or second terminal.

2. A semiconductor output circuit according to claim 1, wherein said first and second resistors are connected in series between said gate terminal and said first terminal, and said drive circuit is connected to said gate terminal of said insulated gate transistor through said first resistor.

3. A semiconductor output circuit according to claim 1, wherein said capacitive element is a bipolar transistor.

4. A semiconductor output circuit according to claim 3, wherein a base and an emitter of said bipolar transistor are directly connected with each other.

5. A semiconductor output circuit according to claim 3, wherein a base and an emitter of said bipolar transistor are connected with each other through a third resistor.

6. A semiconductor output circuit according to claim 3, wherein a back-flow preventing diode is connected in series to said bipolar transistor.

7. A semiconductor output circuit according to claim 1, in which said insulated gate transistor is an LDMOS transistor.

* * * * *